(12) United States Patent
Naruse

(10) Patent No.: US 9,688,532 B2
(45) Date of Patent: Jun. 27, 2017

(54) METHOD OF MANUFACTURING ELECTRONIC DEVICE

(71) Applicant: Seiko Epson Corporation, Tokyo (JP)

(72) Inventor: Atsuki Naruse, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/222,085

(22) Filed: Jul. 28, 2016

(65) Prior Publication Data

US 2017/0050843 A1     Feb. 23, 2017

(30) Foreign Application Priority Data

Aug. 19, 2015   (JP) ................. 2015-161673

(51) Int. Cl.
*B81C 1/00*     (2006.01)

(52) U.S. Cl.
CPC .... *B81C 1/00269* (2013.01); *B81C 2203/031* (2013.01)

(58) Field of Classification Search
CPC .......... B81C 1/00269; B81C 2203/031; H01L 2224/80893; H01L 2224/81893; H01L 2224/82893; H01L 2224/83893; H01L 2224/84893; H01L 2224/85893; H01L 2224/86893
USPC ......................................................... 438/51
See application file for complete search history.

(56) References Cited

U.S. PATENT DOCUMENTS

| 9,144,159 | B2 | 9/2015 | Takagi | |
|---|---|---|---|---|
| 2006/0246630 | A1* | 11/2006 | Sunohara | H01L 23/04 438/125 |
| 2008/0213937 | A1* | 9/2008 | Tsai | H01L 31/18 438/64 |
| 2015/0111615 | A1* | 4/2015 | Chu | H04M 3/2236 455/563 |

FOREIGN PATENT DOCUMENTS

| JP | 2006-069863 A | 3/2006 |
|---|---|---|
| JP | 2013-015477 A | 1/2013 |
| JP | 2013-164285 A | 8/2013 |

* cited by examiner

*Primary Examiner* — Yasser A Abdelaziez
(74) *Attorney, Agent, or Firm* — Harness, Dickey & Pierce, P.L.C.

(57) ABSTRACT

A method of manufacturing an electronic device in which a second substrate (functional element) containing silicon and a third substrate (lid body) containing silicon are bonded to a first substrate containing alkali metal ions by anode bonding includes a first process of performing the anode bonding to bond the second substrate to a surface of the first substrate; a second process of removing at least a portion of the surface of the first substrate to which the third substrate is to be bonded by the anode bonding and exposing a bonding surface after the first process; and a third process of performing the anode bonding to bond the third substrate to the bonding surface of the first substrate.

16 Claims, 7 Drawing Sheets

METHOD OF MANUFACTURING ELECTRONIC DEVICE

BACKGROUND

1. Technical Field

The present invention relates to a method of manufacturing an electronic device using an anode bonding device.

2. Related Art

Traditionally, as an electronic device having a functional element for detecting a physical amount using, for example, microelectromechanical systems (MEMS), an acceleration sensor, a gyro sensor, or the like that has a functional element on a package substrate (substrate) such as a semiconductor substrate or a glass substrate has been proposed.

For example, JP-A-2013-164285 discloses an electronic device having a lid body bonded on the side of a first surface of a substrate (corresponding to the aforementioned package substrate) and a functional element (sensor element) stored in a cavity surrounded by the substrate and the lid body. As the bonding of the functional element to the substrate and the bonding of the lid body to the substrate, an anode bonding method that is performed using an anode bonding device is applied to the electronic device. Specifically, in a process of manufacturing the electronic device, the anode bonding is performed multiple times or the first anode bonding is performed to bond the functional element to the substrate and the second anode bonding is performed to bond the lid body to the substrate.

As described in the aforementioned JP-A-2013-164285, however, in the case where the anode bonding is performed on the same substrate two times to bond the functional element to the substrate and bond the lid body to the substrate, alkali metal ions of the substrate are used (move) upon the first anode bonding, and a portion of the substrate becomes deficient in alkali metal ions essential for the second anode bonding and forms a so-called depleted layer. Thus, the lid body is not sufficiently bonded to the substrate by the second anode bonding. As a result, the strength of the bonding of the lid body to the substrate may be reduced, and the airtightness of the lid body and the substrate may be reduced.

SUMMARY

An advantage of some aspects of the invention is to solve at least a part of the problems described above, and the invention can be implemented as the following forms or application examples.

Application Example 1

A method of manufacturing an electronic device according to Application Example 1 is to manufacture the electronic device in which a second substrate containing silicon and a third substrate containing silicon are bonded to a first substrate containing alkali metal ions by anode bonding. The method according to Application Example 1 includes a first process of performing the anode bonding to bond the second substrate to a surface of the first substrate, a second process of removing at least a portion of the surface of the first substrate to which the third substrate is to be bonded by the anode bonding and exposing a bonding surface after the first process, and a third process of performing the anode bonding to bond the third substrate to the bonding surface of the first substrate.

According to Application Example 1, after the second substrate is bonded to the surface of the first substrate containing alkali metal ions (for example, sodium ions ($Na^+$)) by the anode bonding (first anode bonding) in the first process, the second process is performed to remove at least the portion of the surface of the first substrate to which the third substrate is to be bonded by the anode bonding and expose the bonding surface of the first substrate. In this manner, alkali metal ions within the first substrate move due to the first anode bonding, at least the portion of the first surface that is deficient in alkali metal ions essential for the second anode bonding is removed, and the bonding surface containing remaining alkali metal ions is exposed by the process of removing at least the portion of the surface of the first substrate to which the third substrate is to be bonded. In the third process, the anode bonding is performed to bond the third substrate to the exposed surface containing remaining alkali metal ions and serving as the bonding surface. Thus, the third substrate may be stably bonded to the first substrate at sufficient bonding strength.

Application Example 2

In the method of manufacturing the electronic device according to the aforementioned Application Example 1, it is preferable that a dry etching method be used in the second process.

According to Application Example 2, since at least the portion of the surface of the first substrate may be removed in a single direction by using the dry etching method, the removal process (etching process) may be accurately performed to remove a fine region with a microscopic depth.

Application Example 3

In the method of manufacturing the electronic device according to the aforementioned Application Example 1, it is preferable that the portion with a depth of 550 nm to 1000 nm from the surface be removed in the second process.

According to Application Example 3, the portion of the surface of the first substrate that has the depth of 550 nm to 1000 nm is removed in the second process, and the third substrate may be stably bonded to the first substrate by the anode bonding at sufficient bonding strength in the third process.

Application Example 4

In the method of manufacturing the electronic device according to the aforementioned Application Example 1, it is preferable that the portion with a depth of 650 nm to 1000 nm from the surface be removed in the second process.

According to Application Example 4, the portion of the surface of the first substrate that has the depth of 650 nm to 1000 nm is removed in the second process, and the third substrate may be stably bonded to the first substrate by the anode bonding at sufficient bonding strength in the third process.

Application Example 5

In the method of manufacturing the electronic device according to the aforementioned Application Example 1, it is preferable that the portion with a depth of 825 nm to 1000 nm from the surface be removed in the second process.

According to Application Example 5, variations in the depths of etched portions may be reduced, and the third substrate may be stably bonded to the first substrate by the anode bonding at sufficient bonding strength in the third process.

Application Example 6

In the method of manufacturing the electronic device according to the aforementioned Application Example 1, it is preferable that the anode bonding be performed using heating temperatures that are substantially equal to each other in the first and third processes.

According to Application Example 6, since alkali metal ions that are sufficient for the second anode bonding exist in a region on which the second anode bonding is performed in the second process, the second anode bonding may be performed without an increase in the heating temperature. The second anode bonding performed in this manner can suppress warpage of the second and third substrates that may be caused by the differences, caused by the application of high heating temperatures, between the thermal expansion of the first substrate and the thermal expansion of the second and third substrates. In addition, the second anode bonding performed in the aforementioned manner can reduce stress to be applied to bonding portions. Thus, the bonding can be stably performed.

Application Example 7

In the method of manufacturing the electronic device according to the aforementioned Application Example 1, it is preferable that the third substrate be a lid body enclosing the second substrate.

According to Application Example 7, stable bonding strength can be obtained in the anode bonding of the lid body enclosing the second substrate.

Application Example 8

In the method of manufacturing the electronic device according to the aforementioned Application Example 1, it is preferable that a heating temperature of the anode bonding is equal to or higher than 200° C. and equal to or lower than 390° C. in at least any of the first and third processes.

According to Application Example 8, while the differences between the thermal expansion of the first substrate and the thermal expansion of the second and third substrates are small, the anode bonding may be performed and heating may be performed with the heating temperatures sufficient for the anode bonding.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment is described. Note that the embodiment described below does not in any way limit the subject matter of the invention recited in the appended claims. In addition, Note that all configurations described in the embodiment should not be necessarily taken as essential requirements for the invention. In some of the drawings, X, Y, and Z axes are illustrated for convenience as three axes that are perpendicular to each other. A direction parallel to the X axis is referred to as an "X axis direction", a direction parallel to the Y axis is referred to as a "Y axis direction", and a direction parallel to the Z axis is referred to as a "Z axis direction. In addition, a positive side in the Z axis is referred to as a "top" or an "upper side", while a negative side in the Z axis is referred to as a "bottom" or a "lower side".

Embodiment

Figure 1:
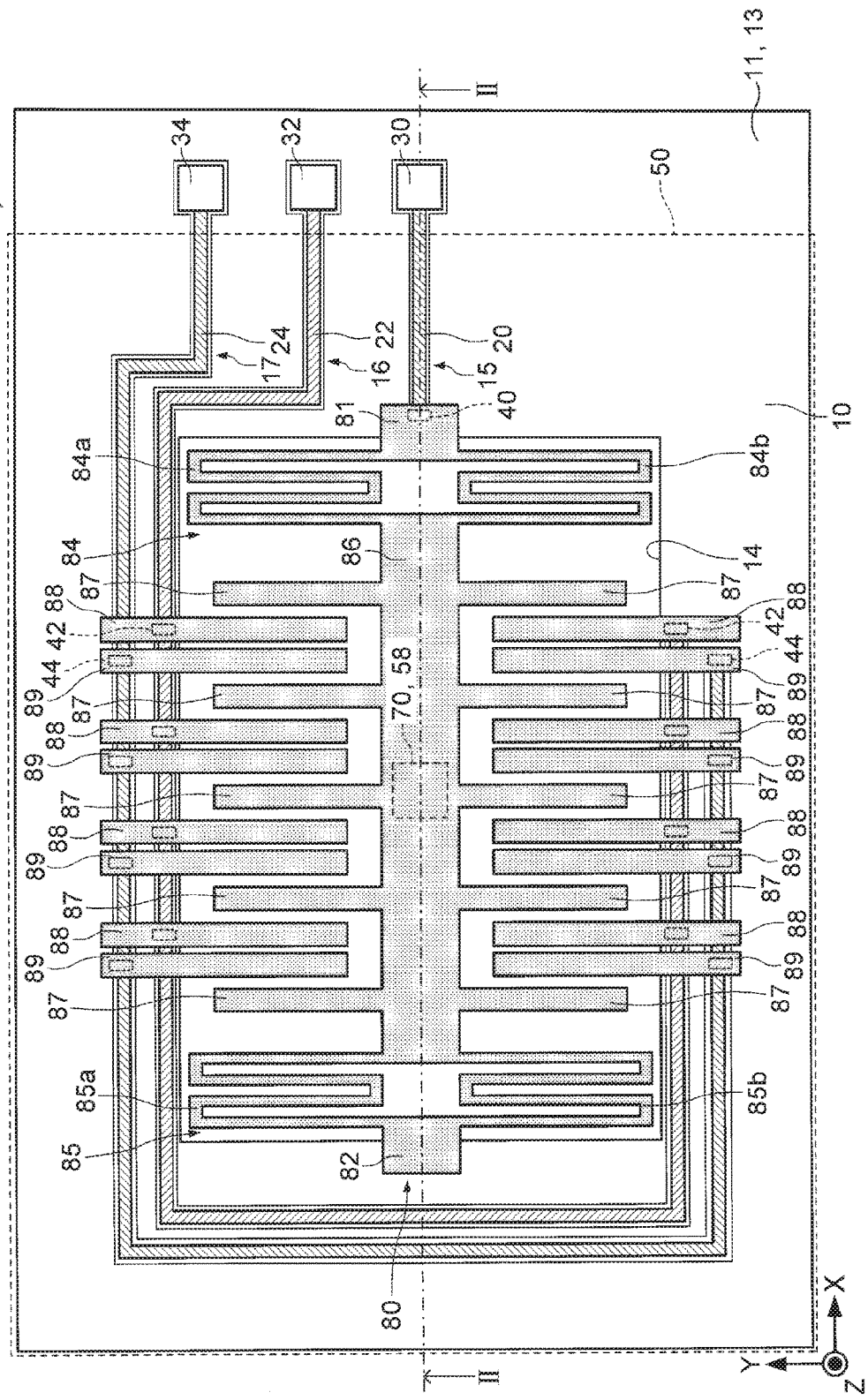
FIG. 1 is a plan view schematically showing an electronic device according to an embodiment.
Figure 2:
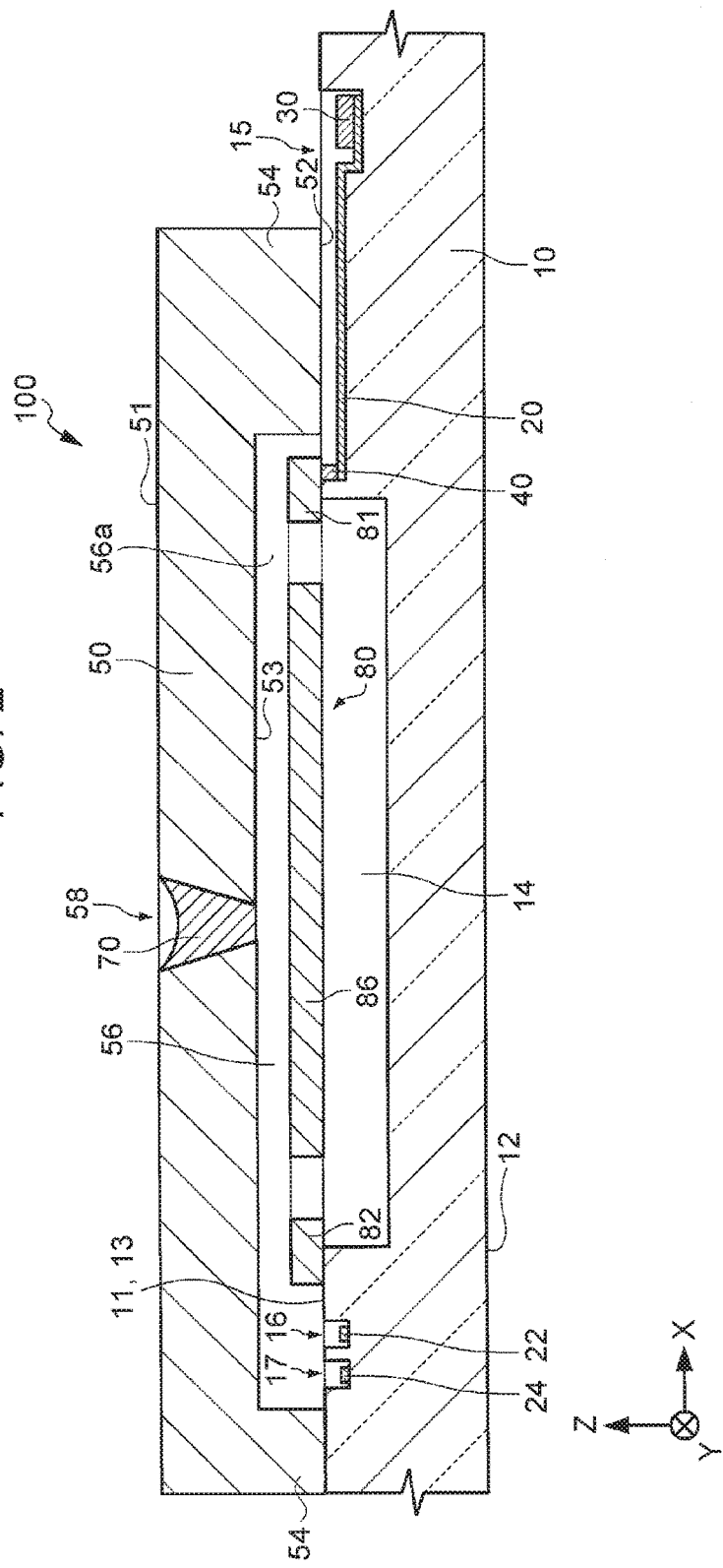
FIG. 2 is a normal cross-sectional view schematically showing the electronic device according to the embodiment, taken along line II-II shown in FIG. 1.
Figure 3:
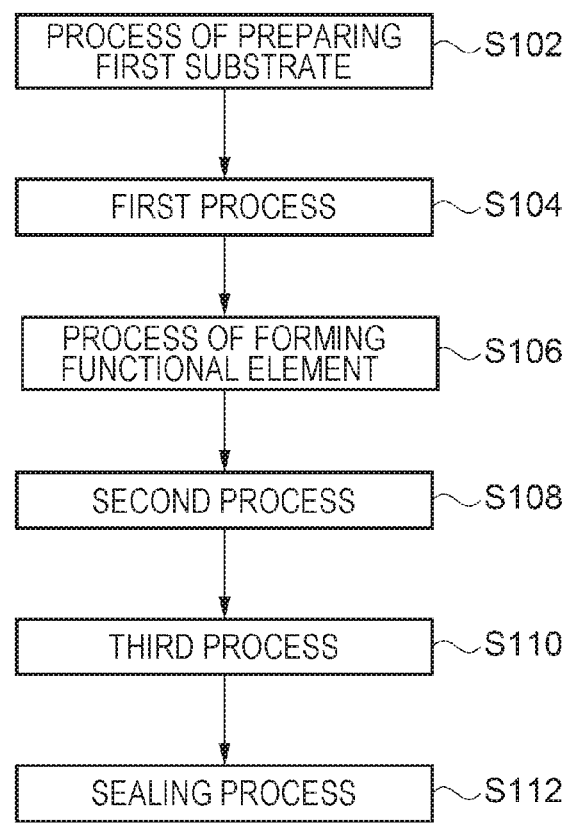
FIG. 3 is a flowchart of a method of manufacturing the electronic device according to the embodiment.
Figure 4A:
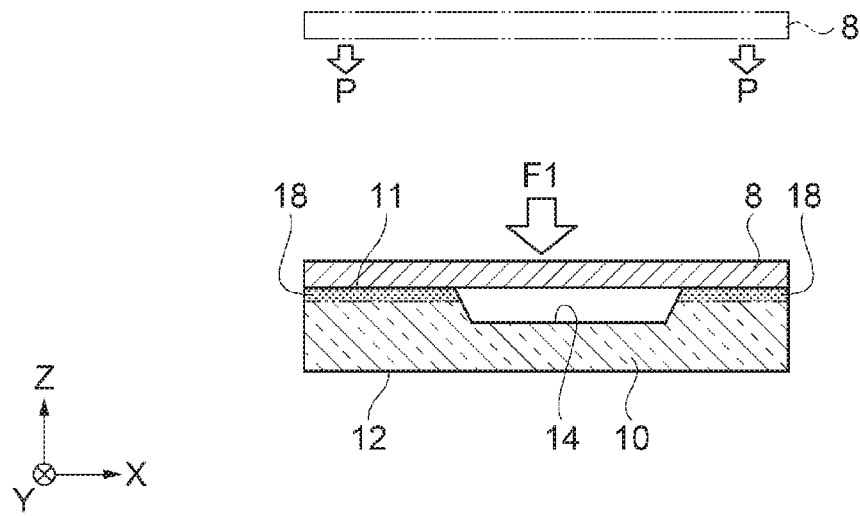
FIG. 4A is a first process flow diagram (normal cross-sectional view) showing the method of manufacturing the electronic device according to the embodiment.
Figure 4B:
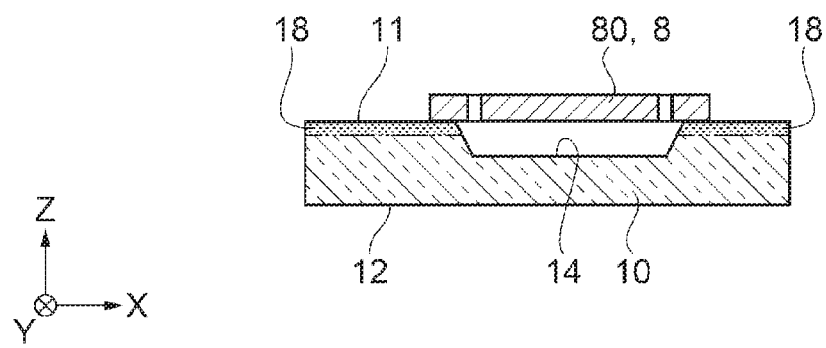
FIG. 4B is a second process flow diagram (normal cross-sectional view) showing the method of manufacturing the electronic device.
Figure 4C:
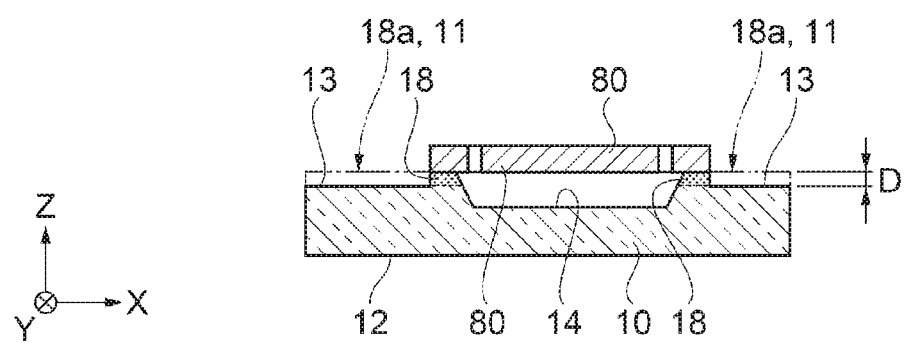
FIG. 4C is a third process flow diagram (normal cross-sectional view) showing the method of manufacturing the electronic device.
Figure 4D:
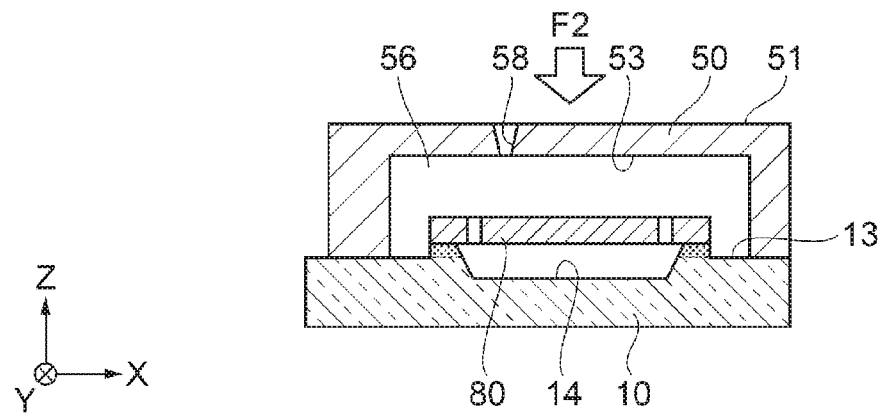
FIG. 4D is a fourth process flow diagram (normal cross-sectional view) showing the method of manufacturing the electronic device.
Figure 4E:
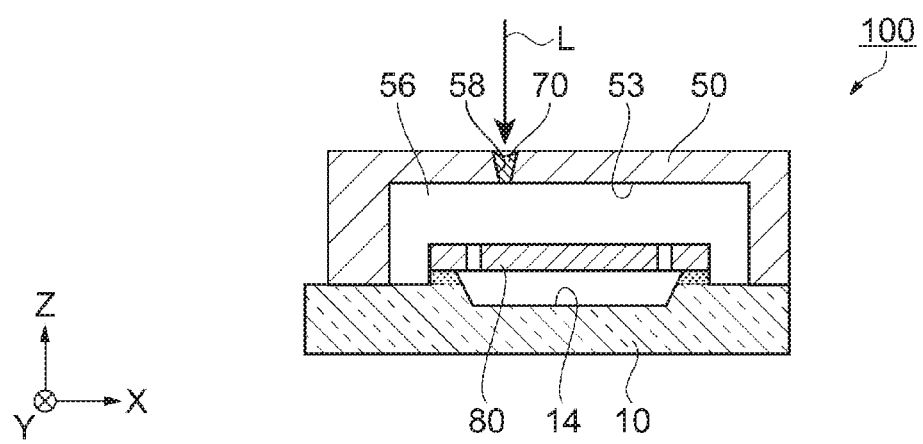
FIG. 4E is a fifth process flow diagram (normal cross-sectional view) showing the method of manufacturing the electronic device.

An electronic device according to the embodiment of the invention and a method of manufacturing the electronic device according to the embodiment of the invention are described with reference to FIGS. 1, 2, 3, and 4A to 4E. FIGS. 1 and 2 schematically show the electronic device according to the embodiment of the invention. FIG. 1 is a plan view and FIG. 2 is a normal cross-sectional view taken along line II-II shown in FIG. 1. FIG. 3 is a flowchart of the method of manufacturing the electronic device according to the embodiment. FIGS. 4A to 4E are process flow diagrams showing the method of manufacturing the electronic device according to the embodiment. FIG. 4A shows the first process flow diagram (normal cross-sectional view schematically showing the electronic device in processes), FIG. 4B shows the second process flow diagram (normal cross-sectional view schematically showing the electronic device in another process), FIG. 4C shows the third process flow diagram (normal cross-sectional view schematically showing the electronic device in another process), FIG. 4D shows the fourth process flow diagram (normal cross-sectional view schematically showing the electronic device in another process), and FIG. 4E shows the fifth process flow diagram (normal cross-sectional view schematically showing the electronic device in another process).

1. Electronic Device

First, the electronic device according to the embodiment is described with reference to FIGS. 1 and 2.

The electronic device 100 according to the embodiment includes a substrate (first substrate) 10, a groove portion 15, a wiring 20, an external connection terminal 30, a lid body (third substrate) 50, and a functional element (second substrate) 80. In addition, the electronic device 100 may include groove portions 16 and 17, wirings 22 and 24, external connection terminals 32 and 34, a through hole 58, and a sealing member 70. In FIG. 1, the lid body 50 and the sealing member 70 are transparently illustrated for convenience.

A substance of the substrate 10 serving as the first substrate is glass (borosilicate glass) or silicon, for example. As shown in FIG. 2, the substrate 10 has a first surface 11 and a second surface 12 located on the side opposite to the first surface 11. The first surface 11 has a recessed portion 14. A movable portion 86 and movable electrode portions 87 of the functional element 80 serving as the second substrate are arranged on the upper side with respect to the recessed portion 14. The movable portion 86 and the movable electrode portions 87 are movable in desired directions due to the recessed portion 14 without being blocked by the substrate 10. A planar shape (shape viewed in the Z axis direction) of the recessed portion 14 is not limited, but is rectangular in this example.

The first surface 14 of the substrate 10 has the groove portion 15. The groove portion 15 extends from the inner side to outer side of a cavity 56 surrounded by the substrate 10 and the lid body 50. The groove portion 15 has a planar shape corresponding to planar shapes of the wiring 20 and external connection terminal 30, for example.

Similarly, the first surface 11 of the substrate 10 has the groove portions 16 and 17. In the example shown in FIG. 1, the groove portions 16 and 17 extend along the outer circumference of the recessed portion 14 while extending from the inner side to outer side of the cavity 56. The groove portion 16 has a planar shape corresponding to planar shapes of the wiring 22 and external connection terminal 32, for example. The groove portion 17 has a planar shape corresponding to planar shapes of the wiring 24 and external connection terminal 34, for example.

The depths (dimensions in the Z axis direction) of the groove portions 15, 16, and 17 are larger than the thicknesses (dimensions in the Z axis direction) of the wirings 20, 22, and 24 and external connection terminals 30, 32, and 34. This configuration can prevent the wirings 20, 22, and 24 and the external connection terminals 30, 32, and 34 from projecting out of the first surface 11 on the upper side (positive side in the Z axis direction) with respect to the first surface 11.

The wiring 20 is provided in the groove portion 15. Specifically, the wiring 20 is provided on a surface of the substrate 10 that defines a bottom surface of the groove portion 15. The wiring 20 electrically connects the functional element 80 to the external connection terminal 30. In the example shown in FIGS. 1 and 2, the wiring 20 is connected to a fixed portion 81 of the functional element 80 via a contact portion 40 provided in the groove portion 15.

The wiring 22 is provided in the groove portion 16. Specifically, the wiring 22 is provided on a surface of the substrate 10 that defines a bottom surface of the groove portion 16. The wiring 22 electrically connects the functional element 80 to the external connection terminal 32. In the example shown in FIGS. 1 and 2, the wiring 22 is connected to fixed electrode portions 88 of the functional element 80 via contact portions 42.

The wiring 24 is provided in the groove portion 17. Specifically, the wiring 24 is provided on a surface of the substrate 10 that defines a bottom surface of the groove portion 17. The wiring 24 electrically connects the functional element 80 to the external connection terminal 34. In the example shown in FIGS. 1 and 2, the wiring 24 is connected to fixed electrode portions 89 of the functional element 80 via contact portions 44.

The external connection terminal 30 is provided on the side of the first surface 11 of the substrate 10. In the example shown in FIG. 2, the external connection terminal 30 is provided on the wiring 20 in the groove portion 15. The external connection terminal 30 is arranged on the outer side of the cavity 56. Specifically, the external connection terminal 30 does not overlap the lid body 50.

Similarly, the external connection terminals 32 and 34 are provided on the side of the first surface 11 of the substrate 10. For example, the external connection terminal is provided on the wiring 22 in the groove portion 16, and the external connection terminal 34 is provided on the wiring 24 in the groove portion 17. The external connection terminals 32 and 34 are arranged on the outer side of the cavity 56. In the example shown in FIG. 1, the external connection terminals 30, 32, and 34 are arranged side by side along the Y axis.

Examples of substances of the wirings 20, 22, and 24 and external connection terminals 30, 32, and 34 are an indium tin oxide (ITO), aluminum, gold, platinum, titanium, tungsten, and chrome. Examples of substances of the contact portions 40, 42, and 44 are gold, copper, aluminum, platinum, titanium, tungsten, and chrome. If the substances of the wirings 20, 22, and 24 and external connection terminals 30, 32, and 34 are a transparent electrode material such as ITO, the substrate 10 is transparent, and foreign substances exist on the wirings 20, 22, and 24 and the external connection terminals 30, 32, and 34, the foreign substances can be easily visually recognized from the side of the second surface 12 of the substrate 10.

Although the electric device 100 that includes the three wirings 20, 22, and 24 and the three external connection terminals 30, 32, and 34 is described above as an example, the number of wirings and the number of external connection terminals may be changed based on the number of functional elements 80 and the shapes of the functional elements 80.

The lid body 50 serving as the third substrate is mounted on a bonding surface 13 exposed by removing at least a portion of the first surface 11 of the substrate 10. The lid body 50 has a third surface 51 and a fourth surface 52 located on the side opposite to the third surface 51. The fourth surface 52 may include an outer circumferential portion 54 to be bonded to the substrate 10 (bonding surface 13). The fourth surface 52 has a recessed portion 56a forming the cavity 56. Thus, the lid body 50 may have a fifth surface 53 defining the cavity 56 enclosing the functional element 80.

Since the wiring 20 is provided in the groove portion 15, the lid body 50 serving as the third substrate is separated from the wiring 20, as shown in FIG. 2. Specifically, the fourth surface 52 of the lid body 50 includes a portion located opposite to the wiring 20 with respect to a void. Similarly, the fourth surface 52 may include portions located opposite to the wirings 22 and 24 with respect to voids.

As a substance of the lid body 50, silicon, glass, or the like can be applied, for example. If the substance of the substrate 10 serving as the first substrate is glass containing alkali metal ions, and the substance of the lid body 50 serving as the third substrate is silicon, anode bonding can be applied as a method of bonding the lid body 50 to the substrate 10. In the embodiment, the lid body 50 is bonded to the substrate 10 by the second anode bonding (third process described later). Thus, stable bonding strength can be obtained in the anode bonding of the lid body 50 enclosing the functional element 80.

The substrate 10 and the lid body 50 may form a package. The substrate 10 and the lid body 50 may form the cavity 56, and the functional element 80 may be stored in the cavity 56. The cavity 56 is sealed so that an inert gas (for example, nitrogen gas) atmosphere exists in the cavity 56 or the cavity 56 is sealed in a reduced pressure state.

The through hole 58 extends from the third surface 51 to fifth surface 53 of the lid body 50 or extends through the lid body 50 in the Z axis direction. The through hole communicates with the cavity 56. For example, it is preferable that the opening size of the through hole 58 become smaller toward the substrate 10 (or toward the fifth surface 53 from the third surface 51) or have a tapered shape. This shape prevents a solder ball from falling upon the dissolution of the solder ball (described later). In addition, since the area of the opening of the through hole 58 becomes smaller toward the cavity 56, the cavity 56 can be reliably sealed.

The sealing member 70 is provided in the through hole 58 and fills the through hole 58. The cavity 56 is sealed by the sealing member 70. A substance of the sealing member 70 is alloy such as AuGe, AuSi, AuSn, SnPb, PbAg, SnAgCu, or SnZnBi, for example.

Since the through hole 58 and the sealing member 70 that fills the through hole 58 are provided, the inert gas (for example, nitrogen gas) atmosphere may be provided in the cavity 56. In addition, the degree of vacuum of the cavity 56 can be adjusted via the through hole 58.

The functional element 80 serving as the second substrate is supported on the first surface 11 of the substrate 10 (or supported on the substrate 10). The functional element 80 is stored in the cavity 56 surrounded by the substrate 10 and the lid body 50. A case where the functional element 80 is an acceleration sensor element (capacitance MEMS acceleration sensor element) for detecting acceleration in the horizontal direction (X axis direction) is described below.

The functional element 80 serving as the second substrate may include the fixed portion 81, a fixed portion 82, coupling portions 84 and 85, the movable portion 86, the movable electrode portions 87, and the fixed electrode portions 88 and 89, as shown in FIGS. 1 and 2.

The movable portion 86 is displaced in the X axis direction (or toward the positive or negative side in the X axis direction) based on a change in the acceleration in the X axis direction while elastically deforming the coupling portions 84 and 85. The sizes of gaps between the movable electrode portions 87 and the fixed electrode portions 88 and the sizes of gaps between the movable electrode portions and the fixed electrode portions 89 change with the displacement. Specifically, capacitance between the movable electrodes portion 87 and the fixed electrode portions 88 and capacitance between the movable electrode portions 87 and the fixed electrode portions 89 change with the displacement. The functional element 80 (or the electronic device 100) can detect the acceleration in the X axis direction based on the changes in the capacitance.

The fixed portions 81 and 82 are bonded to the first surface 11 of the substrate 10. In the example shown in FIGS. 1 and 2, the fixed portions 81 and 82 cross an outer circumferential edge of the recessed portion 14 when the fixed portions 81 and 82 are viewed in the Z axis direction shown in the plan view of FIG. 1.

The movable portion 86 is provided between the fixed portions 81 and 82. In the example shown in FIG. 1, the planar shape of the movable portion 86 is a rectangle shape having long sides extending in the X axis.

The movable portion 86 is continuous with the fixed portions 81 and 82 via the coupling portions 84 and 85. The coupling portions 84 and 85 have desired spring constants and are configured to enable the movable portion 86 to be displaced in the X axis direction. In the example shown in FIG. 1, the coupling portion 84 is made up of two beams 84a and 84b that extend in the X axis direction while extending in a zigzagged manner in the Y axis direction. Similarly, the coupling portion 85 is made up of two beams 85a and 85b that extend in the X axis direction while extending in a zigzagged manner in the Y axis direction.

The movable electrode portions 87 are connected to the movable portion 86. The plurality of movable electrode portions 87 is provided. The movable electrode portions 87 extend from the movable portion 86 on the positive and negative sides in the Y axis direction and are arranged side by side in the X axis direction and form a pectinate array.

One of edges of each of the fixed electrode portions 88 and 89 is bonded, as a fixed edge, to the first surface 11 of the substrate 10, while the other edge of each of the fixed electrode portions 88 and 89 extends, as a free edge, toward the movable portion 86. The plurality of fixed electrode portions 88 is provided, while the plurality of fixed electrode portions 89 is provided. The fixed electrode portions 88 are electrically connected to the wiring 22, while the fixed electrode portions 89 are electrically connected to the wiring 24. The fixed electrode portions 88 and 89 are arranged side by side in the X axis direction and form a pectinate array. Pairs of the fixed electrode portions 88 and 89 are arranged at intervals to be opposite to each other with respect to the movable electrode portions 87 so that a fixed electrode portion 88 of each pair is located on one side (negative side in the X axis direction) with respect to a movable electrode portion 87 and a fixed electrode portion 89 of the pair is located on the other side (positive side in the X axis direction) with respect to the movable electrode portion 87.

The fixed portions 81 and 82, the coupling portions 84 and 85, the movable portion 86, and the movable electrode portions 87 are formed in a unified manner. A substance of the functional element 80 is silicon having conductivity obtained by doping impurities such as phosphorus or boron, for example.

If the substance of the substrate 10 is glass having alkali metal ions, and the substance of the functional element 80 is silicon, anode bonding can be applied as a method of bonding the functional element 80 (the fixed portions 81 and 82 and the fixed electrode portions 88 and 89) to the substrate 10. In the embodiment, the functional element 80 is bonded to the substrate 10 by the first anode bonding (first process described later).

In the electronic device 100, the capacitance between the movable electrode portions 87 and the fixed electrode portions 88 can be measured using the external connection terminals 30 and 32. In the electrode device 100, the capacitance between the movable electrode portions 87 and the fixed electrode portions 89 can be measured using the external connection terminals 30 and 34. In the electronic device 100, the capacitance between the movable electrode portions 87 and the fixed electrode portions 88 and the capacitance between the movable electrode portions and the fixed electrode portions 89 can be separately measured, and the physical amount (acceleration) can be detected with high accuracy based on the results of the measurement.

Although the case where the functional element 80 is the acceleration sensor element for detecting the acceleration in the X axis direction is described above, the functional element 80 may be an acceleration sensor element for detecting acceleration in the Y axis direction or may be an acceleration sensor element for detecting acceleration in the vertical direction (Z axis direction). In addition, the electronic device 100 may include a plurality of such functional elements 80 as described above. The functional element 80 is not limited to the acceleration sensor elements and may be a gyro sensor element for detecting an angular velocity or may be a pressure sensor element.

In the electronic device 100, the functional element 80 serving as the second substrate and the lid body serving as the third substrate are bonded to the substrate 10 serving as the first substrate by the anode bonding. By the anode bonding performed to bond the lid body 50 to the substrate 10, the lid body 50 can be firmly bonded to the substrate 10 and the impact resistance of the electronic device 100 can be improved. For example, if the lid body 50 is bonded to the substrate 10 by an adhesive such as a glass frit, the adhesive spreads upon the bonding and a certain region is required as a bonding margin. However, such a region may be reduced in the anode bonding, and the anode bonding may contribute to the downsizing of the electronic device 100.

2. Method of Manufacturing Electronic Device

Next, the method of manufacturing the electronic device according to the embodiment is described with reference to FIGS. 3 and 4A to 4E. Note that cross-sectional shapes shown in FIGS. 4A to 4E are the same as or similar to the cross-sectional shape shown in FIG. 2. The configuration of the electronic device is described with reference to FIGS. 1, 2, 3, and 4A to 4E.

As shown in FIG. 3, the method of manufacturing the acceleration sensor element includes a process (step S102) of preparing the first substrate 10 serving as the first substrate, a first process (step S104) including the first anode bonding, a process (step S106) of forming the functional element, a second process (step S108) of exposing the bonding surface 13 to the substrate 10, a third process (step S110) including the second anode bonding, and a process (step S112) of sealing the through hole.

Process (Step S102) of Preparing First Substrate

First, the substrate 10 serving as the first substrate 10 is prepared, as shown in FIG. 4A. In the process (step S102) of preparing the first substrate, the recessed portion 14 and the groove portions 15, 16, and 17 are formed on the first surface (one surface) 11 of the substrate 10. The recessed portion 14 and the groove portions 15, 16, and 17 are formed using a photolithography technique and an etching technique, for example. Thus, the substrate 10 having the recessed portion 14 and groove portions 15, 16, and 17 formed on the first surface 11 may be prepared. The substrate 10 is made of borosilicate glass containing alkali metal ions, for example.

Then, the wirings 20, 22, and 24 are formed in the groove portions 15, 16, and 17, respectively. After that, the external connection terminal 30 and the contact portion are formed on the wiring 20 (on the side of the first surface 11 of the substrate 10) and electrically connected to the wiring 20. Similarly, the external connection terminal 32 and the contact portion 42 are formed on the wiring 22 and electrically connected to the wiring 22 (refer to FIG. 1). In addition, the external connection terminal 34 and the contact portion 44 are formed on the wiring 24 and electrically connected to the wiring 24 (refer to FIG. 1).

The wirings 20, 22, and 24 are formed by forming a conductive layer (not shown) by a sputtering method or a chemical vapor deposition (CVD) method and patterning the conductive layer. The patterning is performed using the photolithography technique and the etching technique. The external connection terminals 30, 32, and 34 and the contact portions 40, 42, and 44 are formed by the same method as the wirings 20, 22, and 24, for example.

By the aforementioned process, the substrate 10 that has the recessed portion 14, the wirings 20, 22, and 24, the external connection terminal 30, 32, and 34, and the contact portions 40, 42, and 44 may be prepared.

First Process (Step S104) and Process (Step S106) of Forming Functional Element Next, the functional element 80 is formed on the first surface 11 of the substrate 10 and electrically connected to the wirings 20, 22, and 24. Specifically, a silicon substrate 8 is mounted on the first surface 11 of the substrate 10 so that the silicon substrate 8 overlaps the recessed portion 14 when the silicon substrate 8 is viewed in the Z axis direction shown in FIG. 4A, and the silicon substrate 8 is bonded to the first surface 11 of the substrate 10 by the anode bonding (in the first process (step S104)). Then, the silicon substrate 8 is thinned and patterned to form the functional element 80 (in the process (step S106) of forming the functional element).

First Process (Step S104)

The first process (step S104) is described in detail below. As shown in FIG. 4A, in the first process (step S104), the silicon substrate 8 that will be formed as the functional element 80 is mounted on the first surface (one surface) 11 of the substrate 10 from a direction indicated by arrows P and is subjected to the anode bonding by an anode bonding device (not shown). Specifically, while the second surface 12 of the substrate 10 is fixed to a lower electrode of the anode bonding device (not shown), the anode bonding device (not shown) may perform the anode bonding by causing an upper electrode of the anode bonding device (not shown) to apply a voltage to an upper surface of the silicon substrate 8 while causing the upper electrode to apply pressure (heat) to the upper surface of the silicon substrate 8 in a direction indicated by an arrow F1.

It is preferable that as requirements for the first anode bonding, the anode bonding device apply a direct current voltage of 800 V to 1 kV while applying heat at a temperature of approximately 300° C. In the anode bonding, the heating temperature may be in a range of 290° C. to approximately 500° C. Due to the anode bonding, alkali metal ions within the substrate 10 move to a bonding portion that is included in the substrate 10 and to which the silicon substrate 8 is to be bonded, and a region that exists from the first surface (one surface) 11 of the substrate 10 to a predetermined depth in the bonding portion to which the silicon substrate 8 is bonded becomes deficient in alkali metal ions and forms a depleted layer 18.

Process (Step S106) of Forming Functional Element

By the aforementioned first process (step S104), the silicon substrate 8 bonded to the substrate 10 by the anode bonding is thinned and patterned to form the functional element 80, as shown in FIG. 4B. The patterning is performed using the photolithography technique and the etching technique.

Second Process (Step S108)

Next, as the second process (step S108), the surface (depleted layer 18 on the side of the first surface 11) of the substrate 10 is removed and the bonding surface 13 on which the lid body 50 is bonded to the substrate 10 by the anode bonding is exposed, as shown in FIG. 4C. Specifically, an etching protective film (not shown) is formed so that the functional element 80 bonded to the substrate 10 and all surfaces of the substrate 10 are covered with the etching protective film. The formed etching protective film is patterned in the same shape as the exposed bonding surface 13 and forms a mask. In this example, the bonding surface 13 is exposed by removing the first surface 11 included in the substrate 10 and excluding a region to which the functional element 80 is bonded, and the etching protective film (mask) is provided so that the functional element 80 is covered with the etching protective film (mask). As the etching protective film, an oxide film such as a silicon dioxide ($SiO_2$) film formed by thermally oxidizing a surface of silicon may be used. By performing dry etching using etching gas such as sulfur hexafluoride ($SF_6$), a predetermined depth D of the first surface 11 (surface 18a of the depleted layer 18) of the substrate 10 that is removed, and the exposed bonding surface 13 is formed. The lid body 50 is bonded to the bonding surface 13 in the next third process (step S110).

In the second process (step S108), the surface (depleted layer 18 on the side of the first surface 11) of the substrate 10 is removed using the dry etching or the portion of the substrate 10 is removed in the single direction. Thus, the removal process (etching process) can be accurately performed to remove a fine region with a microscopic depth.

Figure 5:
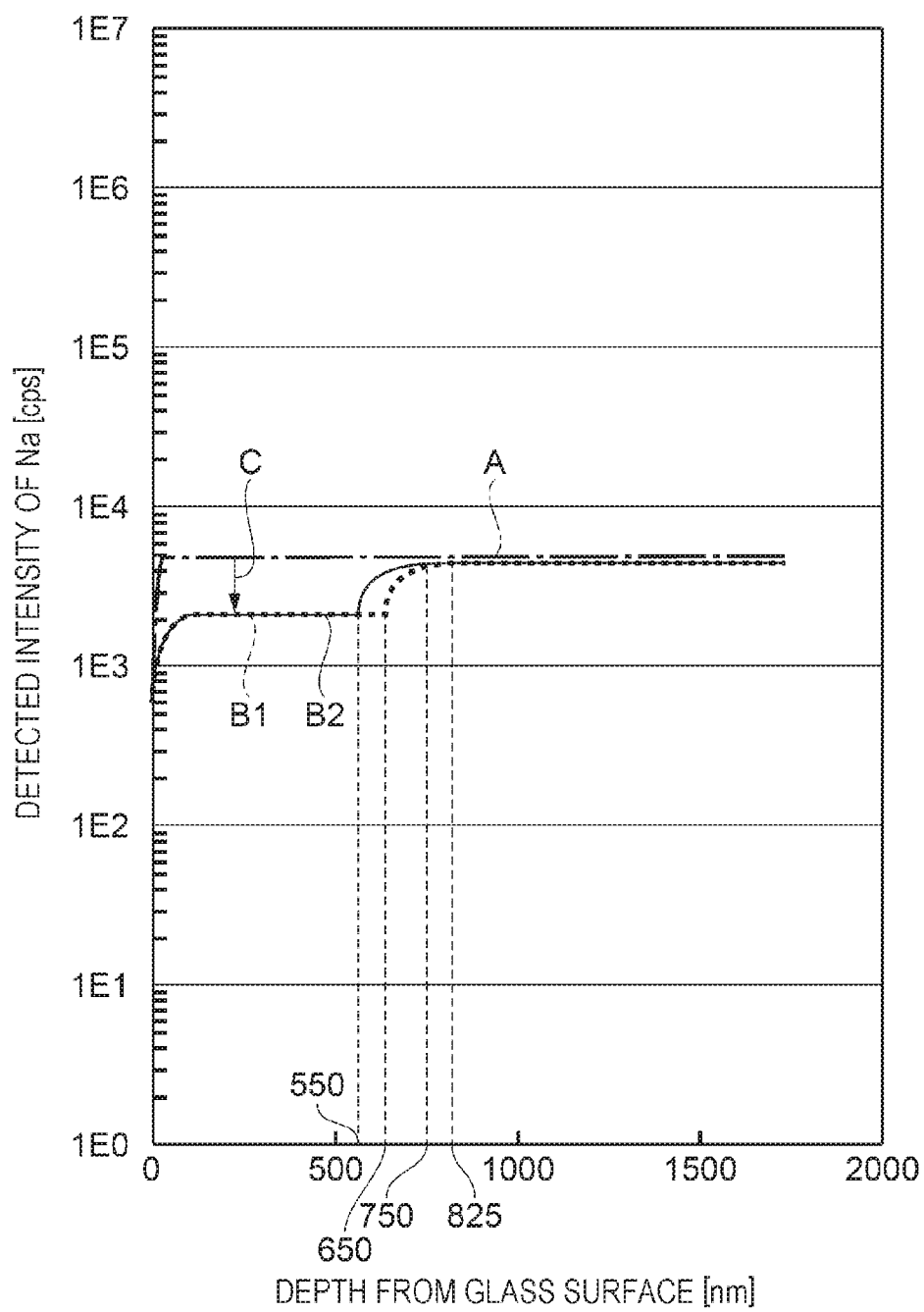
FIG. 5 is a graph showing the correlation between the concentration and depth position of alkali metal ions within a first substrate.

The depleted layer 18 from which alkali metal ions within the substrate 10 (first surface 11) move and that becomes deficient in alkali metal ions essential for the second anode bonding in the first anode bonding (first process (step S104)) is described with reference to FIG. 5. FIG. 5 is a graph showing the correlation between the concentration and depth position of alkali metal ions within the substrate 10. In FIG. 5, the ordinate indicates a detected intensity (proportional to the concentration) of Na serving as alkali metal ions, and the abscissa indicates a depth from the surface (first surface 11) of the substrate 10. In the graph of FIG. 5, a normal Na intensity (concentration) level of the substrate 10 that is not subjected to the anode bonding is treated as a normal level A (indicated by an alternate long and short dash line in FIG. 5). In addition, an Na intensity (concentration) level reduced by the anode bonding performed near the center of the surface of the borosilicate glass wafer is treated as a reduced level B1 (indicated by a dotted line in FIG. 5). In addition, an Na intensity (concentration) level reduced by the anode bonding performed near an outer circumference of the surface of the borosilicate glass wafer is treated as a reduced level B2 (indicated by a solid line in FIG. 5).

As shown in FIG. 5, Na intensity (concentration) levels of the substrate 10 (for example, borosilicate glass) are reduced from the normal level A to the reduced levels B1 and B2 by the anode bonding, as indicated by an arrow C in FIG. 5. The reduced levels B1 and B2 vary depending on measured portions of the glass wafer. Portions of which Na intensity (concentration levels are the reduced levels B1 and B2 and that are included in the substrate 10 (for example, borosilicate glass) and located at depths of 0 to approximately 550 nm to 650 nm from the first surface 11 of the substrate 10 exist. As a portion of the substrate 10 becomes deeper from the depth of 550 nm at which the reduced levels B1 and B2 are detected, the Na intensity (concentration) level of the portion becomes rapidly close to the normal level A. An Na intensity (concentration) level of a portion that is included in the substrate 10 and located at a depth of approximately 825 nm from the first surface 11 of the substrate 10 is substantially equal to the normal level A. In other words, a region that exists from the surface (first surface 11) of the substrate 10 (for example, borosilicate glass) to a depth of approximately 825 nm is affected by the movement, caused by the first anode bonding, of alkali metal ions ($Na^+$ ions).

Thus, at least the portion of the substrate 10 that has the depth at which the substrate 10 is affected by the movement of alkali metal ions ($Na^+$ ions) is removed, and the exposed bonding surface 13 is formed. The formation of the exposed bonding surface 13 can suppress a reduction, caused by the reduction in the number of alkali metal ions, in the bonding strength in the second anode bonding. Specifically, it is preferable that the depth D from the first surface 11 (surface 18a of the depleted layer 18) of the substrate 10 to the bonding surface 13 be equal to or larger than 550 nm and equal to or smaller than 1000 nm. In other words, it is preferable that the first surface 11 of the substrate 10 that has the depth equal to or larger than 550 nm and equal to or smaller than 1000 nm be removed.

By setting, to the range between 550 nm and 1000 nm, the depth from the first surface 11 that is to be removed and is included in the substrate 10, the bonding strength of the anode bonding (second anode bonding) to be performed to bond the lid body 50 to the substrate 10 can be improved, and the lid body 50 can be stably bonded to the substrate 10 in the third process (step S110) described later.

It is more preferable that the depth D from the first substrate 11 (surface 18a of the depleted layer 18) of the substrate 10 to the bonding surface 13 be equal to or larger than 650 nm and equal to or smaller than 1000 nm. By setting the depth D to the range between 650 nm and 1000 nm, the bonding strength of the anode bonding (second anode bonding) to be performed to bond the lid body 50 to the substrate 10 in the third process (step S110) described later can be further improved.

It is more preferable that the depth D from the first surface 11 (surface 18a of the depleted layer 18) of the substrate 10 to the bonding surface 13 be equal to or larger than 825 nm and equal to or smaller than 1000 nm. By setting the depth D to the range between 825 nm and 1000 nm, variations in the depths of etched portions can be reduced and the lid body 50 can be more stably bonded to the substrate 10 due to the sufficient bonding strength of the anode bonding performed to bond the lid body 50 to the substrate 10 in the third process (step S110).

Third Process (Step S110)

As the third process (step S110), the substrate 10 and the lid substrate 50 are bonded to each other by the anode bonding (second anode bonding). Before the second anode bonding, the recessed portion that will form the cavity 56 is formed on the fourth surface 52, and the lid body 50 (refer to FIG. 4D) that has the formed through hole 58 extending from the third surface 51 to the fifth surface is prepared. The lid body 50 may be formed using the photolithography technique and the etching technique including dry etching and wet etching. The lid body 50 is, for example, made of silicon with crystal orientation of (100), and it is preferable that the third surface 51 of the lid body 50 extend along the (100) plane.

As shown in FIG. 4D, in the third process (step S110), the functional element 80 bonded to the first surface (one surface) 11 of the substrate 10 by the anode bonding is stored in the cavity 56, and the lid body 50 mounted on the bonding surface 13 of the substrate 10 is bonded to the substrate 10 by the anode bonding (second anode bonding). Since the lid body 50 is bonded to the bonding surface 13 of the substrate 10 from which the depleted layer 18 (refer to FIG. 4C) that is deficient in alkali metal ions was removed in the aforementioned second process (step S108), the lid body 50 can be stably bonded to the substrate 10 at the sufficient bonding strength in the second anode bonding.

In addition, since the depleted layer 18 (refer to FIG. 4C) that is deficient in alkali metal ions is removed, and alkali metal ions of the normal level exist, requirements (including a requirement for heating) for the second anode bonding may be the same as or close to the requirements for the first anode bonding. According to the requirements for the second anode bonding, the anode bonding device may apply a direct current voltage of 800 V to 1 kV while applying heat at a temperature of approximately 300° C.

Unlike the above description, if the depleted layer that is deficient in alkali metal ions remains, the requirements such as the heating temperature and the voltage to be applied need to be set to high values in the anode bonding (second anode bonding) in order to obtain the sufficient bonding strength. However, if the heating temperature is increased, bonding stress caused by the difference between thermal expansion of the substrate 10 and the thermal expansion of the lid body 50 may increase and the bonding state may be deteriorated or the bonding strength may be reduced.

Figure 6:
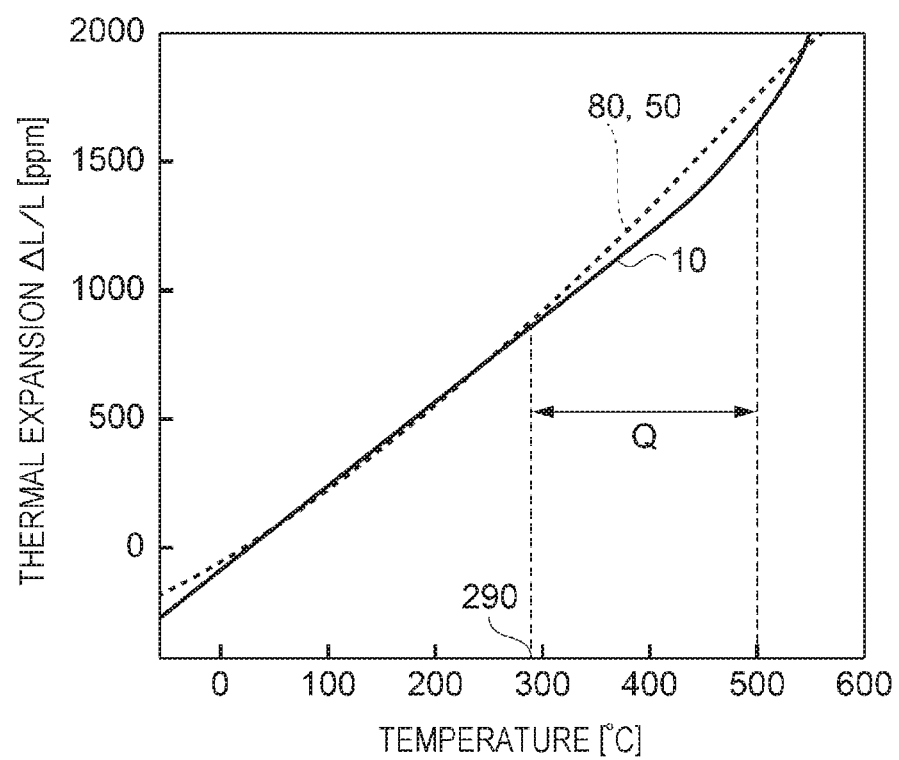
FIG. 6 is a graph showing the coefficients of thermal expansion of the first and second substrates.

A detailed description is given with reference to FIG. 6. A graph of FIG. 6 shows a change in the thermal expansion of the borosilicate glass forming the substrate 10 and a change in the thermal expansion of the silicon forming the lid body 50 (functional element 80). In the graph of FIG. 6, the ordinate indicates the thermal expansion ($\Delta L/L$), and the abscissa indicates the temperature (° C.). For example, as shown in FIG. 6, the difference between the thermal expansion, indicated by a solid line, of the borosilicate glass forming the substrate 10 and the thermal expansion, indicated by a dashed line (dotted line), of the silicon forming the lid body 50 (functional element 80) increases as the temperature increases from approximately 290° C. that is a lower limit of a temperature range Q in which the lid body 50 can be bonded to the substrate 10 by the anode bonding. Thus, due to the increase in the heating temperature of the anode bonding, the difference between the thermal expansion of the substrate 10 and the thermal expansion of the lid body 50 (functional element 80) increases and stress generated during the anode bonding increases. In addition, if the heating temperature of the anode bonding is too low, it is difficult to obtain the sufficient bonding strength. Based on the aforementioned fact, it is preferable that the heating temperature of the anode bonding be in a range between 200° C. and 390° C.

Thus, alkali metal ions that are sufficient for the second anode bonding exist in an anode bonding region to which the second anode bonding is subjected, and the second anode bonding can be performed without an increase in the heating temperature or performed at a temperature that is substantially equal to that in the first anode bonding. The second anode bonding performed in this manner can suppress warpage of the lid body 50 (functional element 80) that may be caused by the difference, caused by the application of a high heating temperature, between the thermal expansion of the substrate 10 and the thermal expansion of the lid body (functional element 80). In addition, the second anode bonding performed in the aforementioned manner can reduce stress to be applied to bonding portions. Thus, the bonding can be stably performed.

Sealing Process (Step S112)

Next, the sealing process (step S112) is described with reference to FIG. 4E. In the sealing process (step S112), the cavity 56 is sealed by filling the through hole 58. Before the sealing of the cavity 56, the atmosphere within the cavity 56 is adjusted via the through hole 58. The inert gas (for example, nitrogen gas) atmosphere may be provided in the cavity 56 via the through hole 58, or the cavity 56 may be sealed in the reduced pressure state.

As shown in FIG. 4E, the sealing member 70 is formed in the through hole 58 and fills the through hole 58. Specifically, the sealing member 70 is formed by providing a spherical solder ball (not shown) in the through hole 58 and dissolving the solder ball by the irradiation of laser light L. The cavity 56 can be sealed by the sealing member 70.

The sealing member 70 is formed while the cavity 56 is sealed under the reduced pressure. Thus, a process of setting the cavity 56 to the reduced pressure state via the through hole 58 can be omitted. In other words, the through hole 58 may not be provided. Thus, the process can be simplified. For example, if the functional element 80 is a gyro sensor element, it is preferable that the cavity 56 be in the reduced pressure state. Thus, the attenuation of the vibration of the gyro sensor element that is caused by air viscosity can be suppressed.

By the aforementioned processes, the electronic device 100 can be manufactured.

According to the aforementioned method of manufacturing the electronic device 100, the functional element 80 is bonded to the first surface (one surface) 11 of the substrate 10 containing alkali metal ions (for example, sodium ions (Na)) by the anode bonding (first bonding) in the first process (step S104), and at least the portion of the first surface (one surface) 11 of the substrate 10 is removed, and the bonding surface 13 that is the region in which the lid body 50 is bonded by the anode bonding is exposed on the side of the first surface 11 of the substrate 10 in the second process (step S108) after the first process (step S104). In the aforementioned manner, alkali metal ions within the substrate 10 move due to the first anode bonding, at least the portion of the first surface (one surface) 11 that forms the depleted layer 18 that is deficient in alkali metal ions essential for the second anode bonding is removed, and the bonding surface 13 containing remaining alkali metal ions is exposed by the process of removing the first surface (one surface) 11 of the substrate 10 to which the lid body 50 is to be bonded. The first surface (one surface) 11 having a larger area than the region in which the lid body 50 is bonded by the anode bonding may be removed, and the bonding surface 13 may be exposed on the side of the first surface 11 of the substrate 10. In this case, even if a bonding surface of the lid body 50 is misaligned from the bonding surface of the substrate 10, the sufficient bonding strength can be obtained. The lid body 50 can be stably bonded to the substrate 10 at the sufficient bonding strength by the anode bonding performed to bond the lid body 50 to the bonding surface 13 containing remaining alkali metal ions in the third process (step S110).

Since the dry etching method is used to remove at least the portion of the first surface (one surface) 11 of the substrate 10 in the second process (step S108), at least the portion of the first surface (one surface) 11 of the substrate 10 can be linearly removed in the single direction or the removal process (etching process) can be accurately performed to remove a fine region with a microscopic depth.

The embodiment describes the method in which the anode bonding is performed two times or the first bonding process and the second bonding process are performed. As the method of manufacturing the electronic device according to the embodiment of the invention, a manufacturing method in which the anode bonding is performed multiple times can be applied, or a manufacturing method in which the anode bonding is performed three or more times can be applied.

The entire disclosure of Japanese Patent Application No. 2015-161673, filed Aug. 19, 2015 is expressly incorporated by reference herein.

What is claimed is:

1. A method of manufacturing an electronic device in which a second substrate containing silicon and a third substrate containing silicon are bonded to a first substrate containing alkali metal ions by anode bonding, comprising:
   a first process of performing the anode bonding to bond the second substrate to a surface of the first substrate;
   a second process of removing at least a portion of the surface of the first substrate to which the third substrate is to be bonded by the anode bonding and exposing a bonding surface after the first process; and
   a third process of performing the anode bonding to bond the third substrate to the bonding surface of the first substrate.

2. The method according to claim 1,
   wherein a dry etching method is used in the second process.

3. The method according to claim 1,
   wherein the portion with a depth of 550 nm to 1000 nm from the first surface is removed in the second process.

4. The method according to claim 1,
   wherein the portion with a depth of 650 nm to 1000 nm from the first surface is removed in the second process.

5. The method according to claim 1,
   wherein the portion with a depth of 825 nm to 1000 nm from the first surface is removed in the second process.

6. The method according to claim 1,
   wherein the anode bonding is performed using heating temperatures that are substantially equal to each other in the first and third processes.

7. The method according to claim 1,
   wherein the third substrate is a lid body enclosing the second substrate.

8. The method according to claim 1,
   wherein a heating temperature of the anode bonding is equal to or higher than 200° C. and equal to or lower than 390° C. in at least any of the first and third processes.

9. The method according to claim 2,
   wherein the portion with a depth of 550 nm to 1000 nm from the first surface is removed in the second process.

10. The method according to claim 2,
    wherein the portion with a depth of 650 nm to 1000 nm from the first surface is removed in the second process.

11. The method according to claim 2,
    wherein the portion with a depth of 825 nm to 1000 nm from the first surface is removed in the second process.

12. The method according to claim 3,
    wherein the anode bonding is performed using heating temperatures that are substantially equal to each other in the first and third processes.

13. The method according to claim 3,
    wherein the third substrate is a lid body enclosing the second substrate.

14. The method according to claim 3,
    wherein a heating temperature of the anode bonding is equal to or higher than 200° C. and equal to or lower than 390° C. in at least any of the first and third processes.

15. The method according to claim 6,
    wherein the third substrate is a lid body enclosing the second substrate.

16. The method according to claim 6,
    wherein a heating temperature of the anode bonding is equal to or higher than 200° C. and equal to or lower than 390° C. in at least any of the first and third processes.

* * * * *